United States Patent
Nilsson

(10) Patent No.: US 9,397,673 B2
(45) Date of Patent: Jul. 19, 2016

(54) OSCILLATOR CROSSTALK COMPENSATION

(71) Applicant: Telefonaktiebolaget L M Ericsson (publ), Stockholm (SE)

(72) Inventor: Magnus Nilsson, Lund (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 8 days.

(21) Appl. No.: 14/259,485

(22) Filed: Apr. 23, 2014

(65) Prior Publication Data
US 2015/0311906 A1 Oct. 29, 2015

(51) Int. Cl.
*H03L 7/00* (2006.01)
*H03L 7/085* (2006.01)
*H03L 7/23* (2006.01)
(Continued)

(52) U.S. Cl.
CPC .............. *H03L 7/085* (2013.01); *H03B 5/1234* (2013.01); *H03K 3/0315* (2013.01); *H03L 7/06* (2013.01); *H03L 7/0802* (2013.01); *H03L 7/099* (2013.01); *H03L 7/23* (2013.01); *H03C 3/095* (2013.01); *H03C 3/14* (2013.01); *H03L 2207/06* (2013.01)

(58) Field of Classification Search
CPC ........ H03K 3/0315; H03C 3/14; H03C 3/095; H03L 7/06; H03L 7/23
USPC ............ 331/2, 46, 57, 167, 34; 332/127, 138, 332/141; 455/260; 327/156, 158
See application file for complete search history.

(56) References Cited

U.S. PATENT DOCUMENTS 4,688,003 A 8/1987 Stromswold
5,311,546 A 5/1994 Paik et al.
(Continued)

FOREIGN PATENT DOCUMENTS

EP 1304805 A2 4/2003
EP 2600544 A1 6/2013
WO 2010089168 A1 8/2010

OTHER PUBLICATIONS

Author Unknown, "3rd Generation Partnership Project; Technical Specification Group Radio Access Network; Evolved Universal Terrestrial Radio Access (E-UTRA); User Equipment (UE) radio transmission and reception (Release 11)," Technical Specification 36.101, Version 11.4.0, Mar. 2013, 3GPP Organizational Partners, 401 pages.
(Continued)

*Primary Examiner* — Arnold Kinkead
(74) *Attorney, Agent, or Firm* — Withrow & Terranova, PLLC

(57) ABSTRACT

Systems and methods for mitigating crosstalk between controlled oscillators of Phase-Locked Loops (PLLs) are disclosed. In one embodiment, a system includes a first PLL including a first controlled oscillator and a second PLL. The system further includes a compensation signal generator adapted to generate a compensation signal at an offset frequency that is approximately equal to an offset between output frequencies of the first and second PLLs and apply the compensation signal to the first controlled oscillator such that the output signal of the first controlled oscillator is modulated by the compensation signal. An amplitude and a phase of the compensation signal are such that, when the compensation signal is applied to the first controlled oscillator, a crosstalk signal output by the first controlled oscillator resulting from crosstalk from the second controlled oscillator of the second PLL to the first controlled oscillator of the first PLL is mitigated.

18 Claims, 8 Drawing Sheets

(51) Int. Cl.
  *H03L 7/06* (2006.01)
  *H03K 3/03* (2006.01)
  *H03B 5/12* (2006.01)
  *H03L 7/08* (2006.01)
  *H03L 7/099* (2006.01)
  H03C 3/09 (2006.01)
  H03C 3/14 (2006.01)

(56) References Cited

U.S. PATENT DOCUMENTS

| | | |
|---|---|---|
| 5,541,959 A | 7/1996 | Myers |
| 6,314,145 B1 | 11/2001 | van Driest |
| 6,587,521 B1 | 7/2003 | Matui |
| 6,985,705 B2 | 1/2006 | Shohara |
| 7,372,337 B2 | 5/2008 | Nayler |
| 7,405,628 B2 | 7/2008 | Hulfachor et al. |
| 7,551,677 B2 | 6/2009 | Crawford |
| 8,031,019 B2 | 10/2011 | Chawla et al. |
| 8,093,943 B2 | 1/2012 | Arai |
| 8,154,329 B2 | 4/2012 | Ecklund et al. |
| 8,198,930 B2 | 6/2012 | Zerbe et al. |
| 8,212,611 B2 | 7/2012 | Akhtar |
| 8,222,939 B2 | 7/2012 | Takinami et al. |
| 8,229,372 B2 | 7/2012 | Hoyerby et al. |
| 8,339,208 B2 | 12/2012 | Luong et al. |
| 8,384,452 B1 | 2/2013 | Parker et al. |
| 9,007,131 B2 | 4/2015 | Mirzaei et al. |
| 2002/0105389 A1 | 8/2002 | Nishimura et al. |
| 2004/0119514 A1 | 6/2004 | Karlquist |
| 2004/0120418 A1 | 6/2004 | Pasternak et al. |
| 2004/0189361 A1 | 9/2004 | Jung |
| 2005/0186920 A1 | 8/2005 | Staszewski et al. |
| 2006/0103566 A1 | 5/2006 | Vemulapalli et al. |
| 2007/0194811 A1 | 8/2007 | Nitsche et al. |
| 2008/0192877 A1 | 8/2008 | Eliezer et al. |
| 2010/0315169 A1 | 12/2010 | Filipovic et al. |
| 2011/0187426 A1 | 8/2011 | Moore |
| 2011/0299572 A1 | 12/2011 | Monsen et al. |
| 2013/0229213 A1 | 9/2013 | Park et al. |
| 2013/0243044 A1 | 9/2013 | Husted et al. |
| 2013/0271186 A1 | 10/2013 | Hossain et al. |
| 2014/0347108 A1 | 11/2014 | Zerbe et al. |

OTHER PUBLICATIONS

Mirzaei, Ahmad et al., "21.8 A Pulling Mitigation Technique for Direct-Conversion Transmitters," 2014 IEEE International Solid-State Circuits Conference, Session 21, San Francisco, CA, Feb. 9-13, 2014, IEEE, pp. 374-375.
International Search Report for International Patent Application No. PCT/EP2015/058283, mailed Jul. 14, 2015, 3 pages.
International Search Report for International Patent Application No. PCT/EP2015/058982, mailed Jul. 24, 2015, 4 pages.
Non-Final Office Action for U.S. Appl. No. 14/264,506, mailed Aug. 20, 2015, 6 pages.
Notice of Allowance for U.S. Appl. No. 14/449,468, mailed Aug. 7, 2015, 8 pages.
International Search Report for International Patent Application No. PCT/EP2015/064623, mailed Nov. 16, 2015, 3 pages.
Author Unknown, "derive," Dictionary.com, www.dictionary.reference.com/browse/derive, accessed Feb. 2, 2016, Random House, Inc., 6 pages.
Final Office Action for U.S. Appl No. 14/264,506, mailed Feb. 2, 2016, 15 pages.
Applicant-Initiated Interview Summary for U.S. Appl. No. 14/264,506, mailed Mar. 16, 2016, 6 pages.

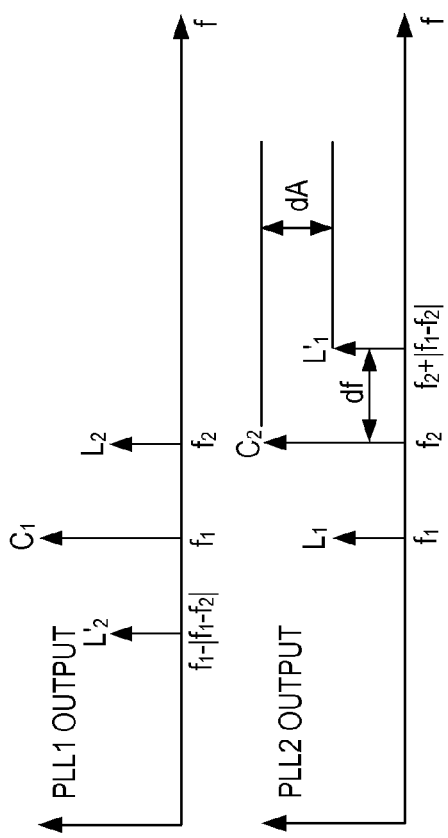
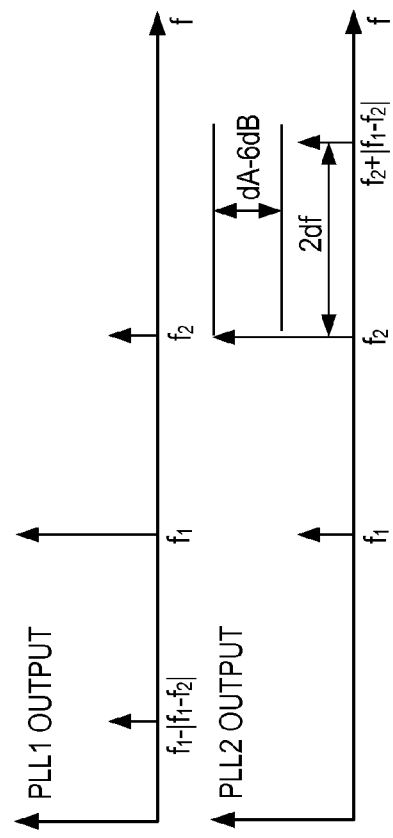
FIG. 2A
FIG. 2B

OSCILLATOR CROSSTALK COMPENSATION

FIELD OF THE DISCLOSURE

The present disclosure relates to oscillator crosstalk compensation in integrated circuits.

BACKGROUND

A common radio architecture in integrated Radio Frequency (RF) transceivers for wireless devices for a cellular communications network utilizes direct conversion receiver(s) and direct conversion transmitter(s). In a direct conversion transmitter, baseband information to be transmitted is upconverted directly from baseband to the desired RF carrier frequency. Likewise, in a direct conversion receiver, a received RF signal is downconverted directly from a corresponding RF carrier frequency to baseband. Direct conversion provides a power optimized implementation in an integrated circuit. Direct conversion transmitters and direct conversion receivers require a good, stable Local Oscillator (LO) signal. As such, the LO signal for a direct conversion transmitter or receiver is normally generated using a Phase-Locked Loop (PLL), where a controllable LC oscillator is phase-locked to a stable Crystal Oscillator (XO).

For a wireless device operating in, e.g., Evolved Universal Terrestrial Radio Access (E-UTRA) Frequency Division Duplexing (FDD) mode, both the transmitter of the wireless device and the receiver of the wireless device are operating at the same time. This in turn means that a PLL generating the LO signal for direct upconversion in the transmitter (which is referred to herein as a transmit PLL) and the PLL generating the LO signal for direction downconversion in the receiver (which is referred to herein as a receive PLL) are enabled, or running, at the same time. Further, if the wireless device is communicating in multiple aggregated frequency bands using a Carrier Aggregation (CA) scheme, several transmit PLL(s) and/or receive PLL(s) will be enabled, or running, at the same time. Several PLLs running at the same time may also be required in other scenarios such as, e.g., when the wireless device has two simultaneous "calls" (also referred to as a dual call scenario). The two simultaneous calls may be, e.g., a voice call via a Global System for Mobile Communications (GSM) Radio Access Network (RAN) and a data call via an E-UTRA network (i.e., a $3^{rd}$ Generation Partnership Program (3GPP) Long Term Evolution (LTE) RAN).

One issue that arises from multiple simultaneously enabled PLLs when integrated into a single Integrated Circuit (IC) is crosstalk between the PLLs and, in particular, crosstalk between the controlled LC oscillators of the PLLs. LC oscillators are based on inductors that are implemented using metal wires in the IC. These inductors tend to be relatively large devices in the IC and normally have a size of several hundred micrometers. When implementing two or more LC oscillators on the same IC, there will inevitably be crosstalk between the LC oscillators. The crosstalk can be both inductive and capacitive. This crosstalk can be mitigated by increasing the distance between the LC oscillators, but the distance between the LC oscillators and thus the mitigation achieved by increasing the distance between the LC oscillators is limited by the size of the IC and the number of LC oscillators in the IC. Inductive crosstalk can be somewhat mitigated by using complex inductor layouts at the expense of lowered Q-value and thus increased power consumption. Further, the amount of crosstalk is difficult to predict using simulation because the amount of crosstalk is very much dependent on metallization between the LC oscillators in the IC.

The issue of crosstalk between PLLs on an IC is illustrated in FIG. 1 and FIGS. 2A and 2B. In particular, FIG. 1 illustrates an IC 10 including two PLLs 12-1 and 12-2. As illustrated, the PLLs 12-1 and 12-2 include Controlled Oscillators (COs) 14-1 and 14-2, respectively. The COs 14-1 and 14-2 are more particularly LC oscillators. In this example, the CO 14-1 includes an inductor 16-1, a capacitor 18-1, and a pair of cross-coupled transistors 20-1 and 22-1 having cross-coupled gates and drains. Likewise, the CO 14-2 includes an inductor 16-2, a capacitor 18-2, and a pair of cross-coupled transistors 20-2 and 22-2 having cross-coupled gates and drains. Coupling (k) between the inductors 16-1 and 16-2 results in crosstalk between the two COs 14-1 and 14-2.

FIG. 2A illustrates output spectra of the PLLs 12-1 and 12-2, and more specifically of the COs 14-1 and 14-2, of FIG. 1 according to a first example in which the COs 14-1 and 14-2 are placed in close proximity to one another. An output signal ($C_1$) of the CO 14-1 is at a first frequency ($f_1$), and an output signal ($C_2$) of the CO 14-2 is at a second frequency ($f_2$). Due to the coupling (k) between the inductors 16-1 and 16-2, the output signal ($C_2$) of the CO 14-2 results in a crosstalk signal from the CO 14-2 being injected into the CO 14-1 at the second frequency ($f_2$). The amplitude limiting function of the CO 14-1 converts the crosstalk signal at the second frequency ($f_2$) into a phase-modulation of the CO 14-1, which in turn results in a symmetric phase-modulated output spectra for the CO 14-1. The symmetric phase-modulated output spectra for the CO 14-1 includes modulation sideband signals ($L_2$ and $L_2'$) at frequencies of $f_1+|f_1-f_2|=f_2$ and $f_1-|f_1-f_2|$, respectively, where in this example $|f_1-f_2|$ is equal to a value "df." Note that the modulation sideband signal ($L_2$) corresponds to the crosstalk signal at the second frequency ($f_2$). Likewise, due to the coupling (k) between the inductors 16-1 and 16-2, the output signal ($C_1$) of the CO 14-1 results in a crosstalk signal from the CO 14-1 being injected into the CO 14-2 at the first frequency ($f_1$). The amplitude limiting function of the CO 14-2 converts the crosstalk at the first frequency ($f_1$) into a phase-modulation of the CO 14-2, which in turn results in a symmetric phase-modulated output spectra for the CO 14-2. The symmetric phase-modulated output spectra for the CO 14-2 includes modulation sideband signals ($L_1$ and $L_1'$) at frequencies of $f_2-|f_1-f_2|=f_1$ and $f_2+|f_1-f_2|$, respectively, where again in this example $|f_1-f_2|$ is equal to a value "df." Note that the modulation sideband signal ($L_1$) corresponds to the crosstalk signal at the first frequency ($f_1$).

Also, the COs 14-1 and 14-2, which again are LC oscillators, act as filters to the crosstalk signals. Thus, when increasing the offset between $f_1$ and $f_2$ (i.e., when increasing $|f_1-f_2|$, the level of the crosstalk signals (i.e., the level of the phase-modulation sidebands) will roll off by 6 Decibels (dB) per octave. For example, as illustrated in FIG. 2B, when the offset frequency is doubled, the level of the crosstalk signals decreases by 6 dB.

In normal E-UTRA FDD mode, the duplex distance is fixed and relatively high. In this case, only two PLLs are active, and the PLL isolation requirements are normally manageable. However, when adding CA or a dual call, the number of frequency combinations substantially increases, several PLLs are active at the time, and oscillator frequencies can be placed very close to one another, which in turn results in higher levels of crosstalk signals.

Further, the crosstalk becomes particularly problematic if the modulation sidebands are placed in a position that causes receiver desensitization. For example, if the output of the transmit PLL has a modulation sideband on the receive frequency, the modulation sideband results in receiver desensitization. As another example, receive desensitization also occurs if the output of the receiver PLL includes a modulation sideband on the transmit frequency. A similar issue arises if the output of the receiver PLL includes a modulation sideband on other transmit frequencies of the wireless device such as, e.g., a Wireless Local Area Network (WLAN) transmit frequency.

European Patent Application Publication No. EP 2600544 A1, entitled "Technique for crosstalk reduction," describes a technique for cancelling or reducing crosstalk between COs in an IC. In particular, in order to cancel or reduce crosstalk from a first PLL to a second PLL in an IC, a cancellation signal is generated at an output frequency of the first PLL (i.e., at the same frequency as the crosstalk signal from the CO of the first PLL injected into the CO of the second PLL) and injected into the CO of the second PLL. The cancellation signal is generated from the output of the first PLL. An amplitude of the cancellation signal is controlled to be substantially the same as that of the crosstalk signal, and a phase of the cancellation signal is controlled to be substantially the opposite of that of the crosstalk signal. When injected into the CO of the second PLL, the cancellation signal cancels or reduces the crosstalk signal from the first PLL.

While the technique described in EP 2600544 A1 provides good crosstalk reduction, there remains a need for systems and methods for improved crosstalk reduction.

SUMMARY

Systems and methods for mitigating crosstalk between controlled oscillators (COs) of Phase-Locked Loops (PLLs) are disclosed. In one embodiment, a system includes a first PLL including a first CO adapted to provide an output signal at a first frequency and a second PLL including a second CO adapted to provide an output signal at a second frequency. The system further includes a compensation signal generator adapted to generate a compensation signal at an offset frequency that is approximately equal to an offset between the first frequency and the second frequency and apply the compensation signal to the first CO such that the output signal of the first CO is modulated by the compensation signal. An amplitude and a phase of the compensation signal are such that, when the compensation signal is applied to the first CO, a crosstalk signal output by the first CO resulting from crosstalk from the second CO of the second PLL to the first CO of the first PLL is mitigated (e.g., reduces or cancelled).

In one embodiment, the first CO is a first controlled Inductor and Capacitor (LC) oscillator comprising a resonant tank including an inductor and one or more capacitors, and the second CO is a second controlled LC oscillator including a resonant tank comprising an inductor and one or more capacitors. Further, in one embodiment, the system is included in an Integrated Circuit (IC), and the crosstalk is due to inductive coupling between the inductor of the first controlled LC oscillator and the inductor of the second controlled LC oscillator.

In one embodiment, the compensation signal generator is further adapted to apply the compensation signal to the first controlled LC oscillator by switching a capacitor of the one or more capacitors in the resonant tank of the first controlled LC oscillator.

In one embodiment, the compensation signal generator includes an oscillator adapted to provide an output signal at the offset frequency and adjustment circuitry adapted to adjust an amplitude and phase of the output signal of the oscillator to provide the compensation signal at the offset frequency. In one embodiment, the oscillator is a ring oscillator. Further, in one embodiment, the system further includes an error signal detector adapted to detect the crosstalk signal and control the amplitude and the phase of the compensation signal via the adjustment circuitry such that the crosstalk is mitigated.

In one embodiment, the first PLL is an all-digital PLL.

In one embodiment, the system is included in an IC.

In one embodiment, a method of mitigating a crosstalk signal in an output signal of a CO of a victim PLL resulting from crosstalk between a CO of an interfering PLL and the CO of the victim PLL is provided. In one embodiment, the method includes generating a compensation signal at an offset frequency that is approximately equal to an offset between an output frequency of the CO of the victim PLL and an output frequency of the CO of the interfering PLL and applying the compensation signal to the CO of the victim PLL such that the output signal of the CO of the victim PLL is modulated by the compensation signal. An amplitude and phase of the compensation signal are such that, when the compensation signal is applied to the CO of the victim PLL, the crosstalk signal in the output signal of the CO of the victim PLL resulting from the crosstalk between the CO of the interfering PLL and the CO of the victim PLL is mitigated.

Those skilled in the art will appreciate the scope of the present disclosure and realize additional aspects thereof after reading the following detailed description of the embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A and 2B illustrate two examples of the output spectra of the two PLLs of FIG. 1, where the output spectra include modulation sideband signals resulting from crosstalk between the two PLLs;

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 3:
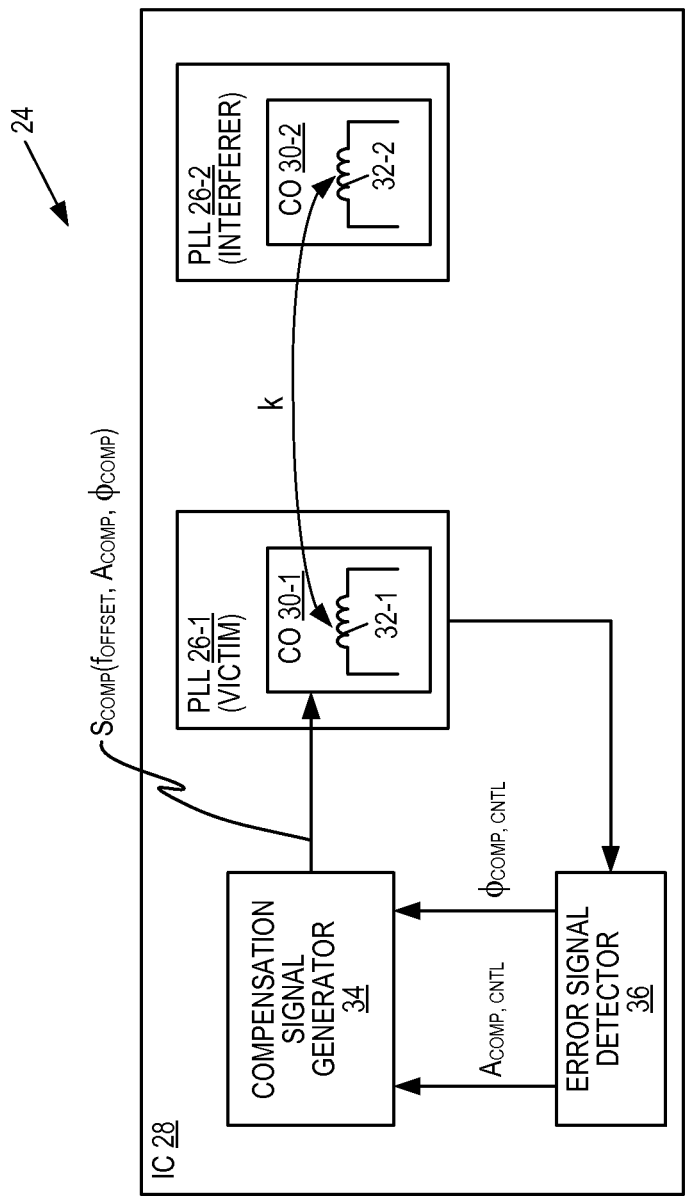
FIG. 3 illustrates a system including two PLLs in an IC, where the system utilizes a compensation signal at an offset frequency between the two PLLs to mitigate crosstalk according to one embodiment of the present disclosure.

Systems and methods for mitigating crosstalk between Controlled Oscillators (COs) of Phase-Locked Loops (PLLs) in an Integrated Circuit (IC) are disclosed. While the embodiments described herein relate to mitigating crosstalk between COs of PLLs in an IC, the concepts disclosed herein may also be used to mitigate crosstalk between COs of PLLs that are not implemented in the same IC. FIG. 3 illustrates a system 24 for mitigating crosstalk between PLLs 26-1 and 26-2 in an IC 28 according to one embodiment of the present disclosure. The PLL 26-1 and the PLL 26-2 include COs 30-1 and 30-2, respectively. The COs 30-1 and 30-2 are LC oscillators and, in some embodiments, are voltage controlled LC oscillators or digitally controlled LC oscillators. As illustrated, the COs 30-1 and 30-2 include inductors 32-1 and 32-2, respectively. Coupling (k) between the inductors 32-1 and 32-2 results in crosstalk between the COs 30-1 and 30-2. In particular, the coupling (k) results in a crosstalk signal at an output frequency ($f_1$) of the CO 30-1 of the PLL 26-1 being injected into the CO 30-2 of the PLL 26-2. Likewise, the coupling (k) results in a crosstalk signal at an output frequency ($f_2$) of the CO 30-2 of the PLL 26-2 being injected into the CO 30-1 of the PLL 26-1. Note that while inductive coupling is described herein as the source of the crosstalk between the COs 30-1 and 30-2, the present disclosure is not limited thereto. There may be additional or alternative sources of the crosstalk between the COs 30-1 and 30-2 (e.g., substrate leakage).

Figure 1:
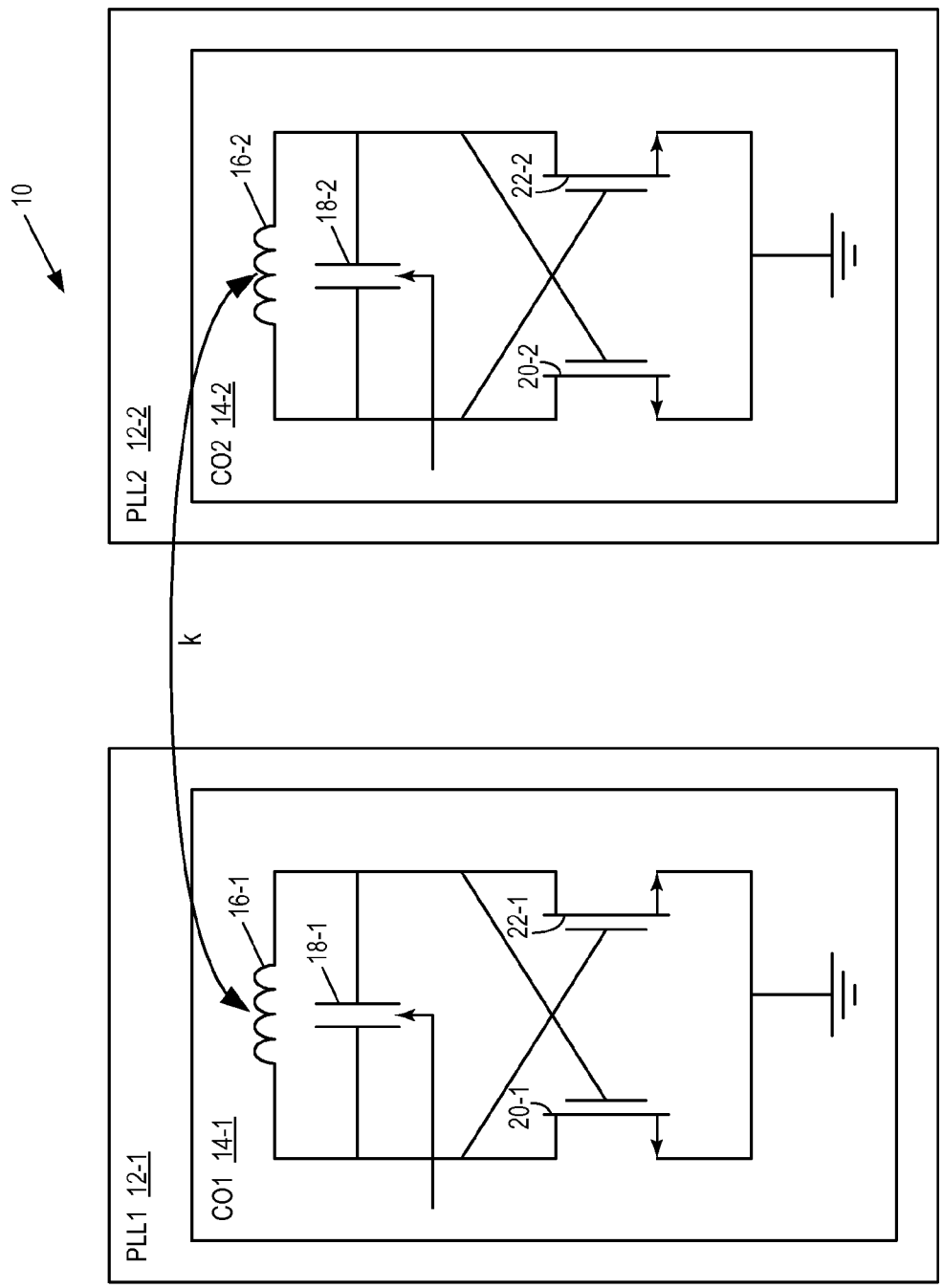
FIG. 1 illustrates crosstalk between Controlled Oscillators (COs) of two Phase-Locked Loops (PLLs) in an Integrated Circuit (IC)

As discussed above with respect FIG. 1 and FIGS. 2A and 2B, the crosstalk signal injected into the CO 30-1 is at the output frequency ($f_2$) of the CO 30-2 of the PLL 26-2. An amplitude limiting function of the CO 30-1 converts the crosstalk signal at the second frequency ($f_2$) into a phase-modulation of the CO 30-1, which in turn results in a symmetric phase-modulated output spectra for the CO 30-1. The symmetric phase-modulated output spectra for the CO 30-1 includes modulation sideband signals (which for clarity are referred to herein as crosstalk sideband signals) at frequencies of $f_1+|f_1-f_2|=f_2$ and $f_1-|f_1-f_2|$, respectively. Note that the crosstalk sideband signal at the second frequency ($f_2$) corresponds to the crosstalk signal injected from the CO 30-2.

The system 24 further includes a compensation signal generator 34 that generates a compensation signal ($S_{COMP}$) at an offset frequency ($f_{OFFSET}$) and applies, or injects, the compensation signal ($S_{COMP}$) into the CO 30-1 to mitigate the crosstalk signal injected into the CO 30-1 from the CO 30-2. In this regard, the PLL 26-1 is referred to herein as a victim PLL 26-1, and the PLL 26-2 is referred to herein as an interfering PLL 26-2. The offset frequency ($f_{OFFSET}$) at which the compensation signal ($S_{COMP}$) is generated is approximately equal to, and in some embodiments is equal to, an offset between an output frequency ($f_1$) of the CO 30-1 in the PLL 26-1 and an output frequency ($f_2$) of the CO 30-2 in the PLL 26-2. In other words, $f_{OFFSET} \cong |f_1-f_2|$. Further, the offset frequency ($f_{OFFSET}$) is known in advance based on the output frequencies ($f_1$ and $f_2$) of the PLLs 26-1 and 26-2, respectively. Importantly, the compensation signal ($S_{COMP}$) is generated at the offset frequency ($f_{OFFSET}$) rather than the output frequency ($f_2$) of the interfering PLL 26-2. By injecting the compensation signal ($S_{COMP}$) into the CO 30-1, the compensation signal ($S_{COMP}$) modulates the output signal of the CO 30-1 (which is at the output frequency ($f_1$)) to provide modulation sideband signals (which for clarity are referred to herein as compensation sideband signals) at $f_1+f_{OFFSET}$ and $f_1-f_{OFFSET}$, which are the same frequencies at which the crosstalk sideband signals resulting from the crosstalk signal from the CO 30-2 of the interfering PLL 26-2 are located. As discussed below, by properly adjusting an amplitude ($A_{COMP}$) and a phase ($\phi_{COMP}$) of the compensation signal (Scamp), the compensation sideband signals mitigate (i.e., cancel or reduce) the crosstalk sideband signals and thereby mitigate the crosstalk signal injected into the CO 30-1 from the CO 30-2.

The compensation signal generator 34 adjusts the amplitude ($A_{COMP}$) and the phase ($\phi_{COMP}$) of the compensation signal ($S_{COMP}$) based on amplitude and phase control inputs ($A_{COMP,CNTRL}$ and $\phi_{COMP,CNTL}$) from an error signal detector 36. The error signal detector 36 detects an error signal in the output of the PLL 26-1. Initially, the error signal is the crosstalk signal from the CO 30-2 (which corresponds to the crosstalk sideband signal at the output frequency ($f_2$)). However, after mitigation of the crosstalk signal begins, the error signal is the residual crosstalk signal after mitigation. Based on the error signal, the error signal detector 36 controls the amplitude and phase control inputs ($A_{COMP,CNTRL}$ and $\phi_{COMP,CNTL}$) provided to the compensation signal generator 34 (thereby causing the compensation signal generator 34 to adjust the amplitude ($A_{COMP}$) and the phase ($\phi_{COMP}$) of the compensation signal ($S_{COMP}$)) in such a manner that the error signal detected in the output of the CO 30-1 and thus the crosstalk signal from the CO 30-2 is mitigated (i.e., cancelled or reduced). In particular, the phase ($\phi_{COMP}$) is controlled to be approximately opposite (i.e., approximately 180 degrees out-of-phase) to that of the crosstalk signal as indicated by the error signal, and the amplitude ($A_{COMP}$) is controlled to be approximately equal to that of the crosstalk signal (e.g., by minimizing the error signal after the phase ($\phi_{COMP}$) is configured).

Figure 4:
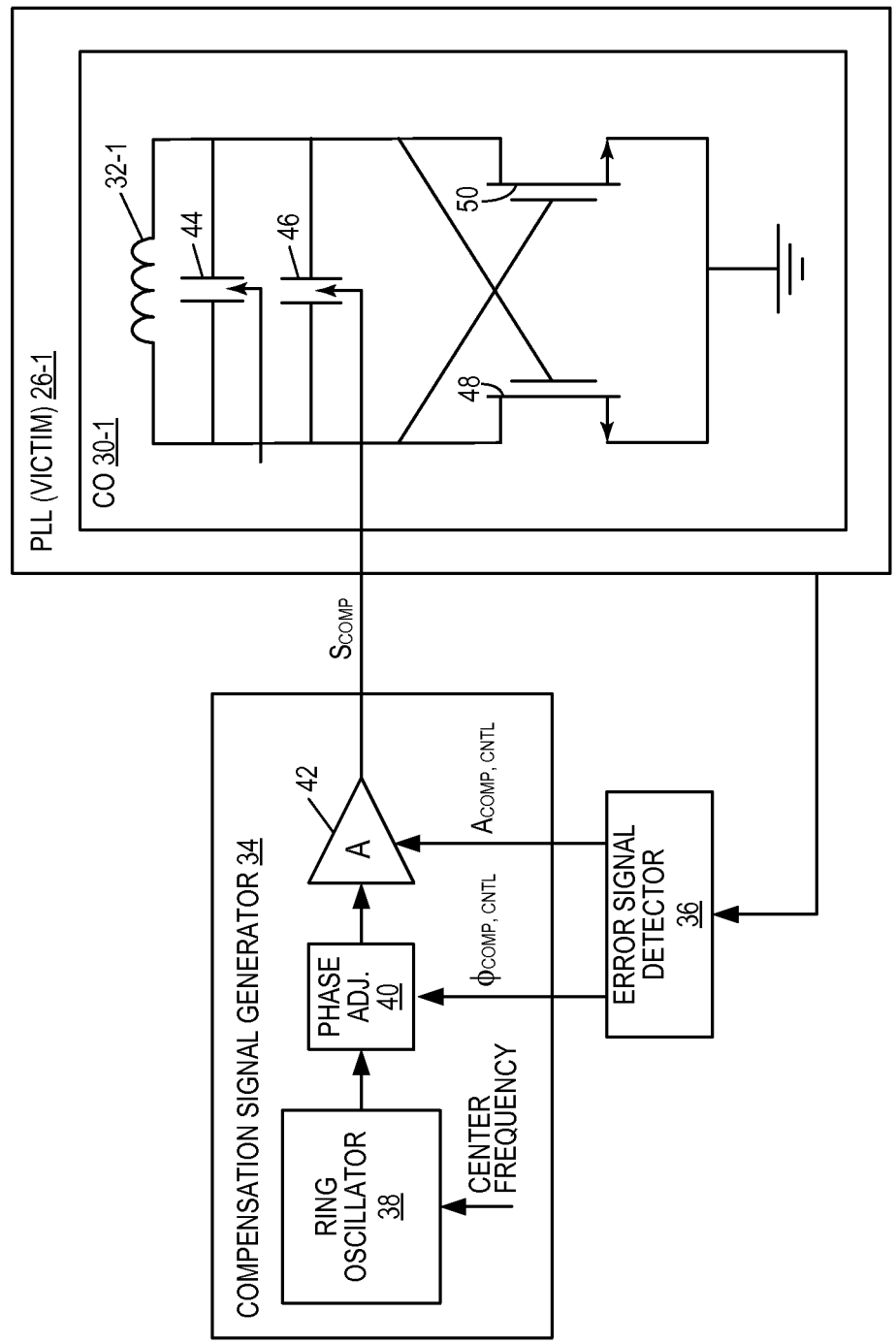
FIG. 4 illustrates the system of FIG. 3 in more detail according to one embodiment of the present disclosure.

FIG. 4 is a more detailed illustration of the compensation signal generator 34 and the CO 30-1 of FIG. 3 according to one embodiment of the present disclosure. In this embodiment, the compensation signal generator 34 includes a ring oscillator 38 and adjustment circuitry including phase adjustment circuitry 40 and amplitude adjustment circuitry 42. Note that if compensation is performed for both PLLs 26-1 and 26-2, the same ring oscillator 38 may be used for both compensation signal generators 34. The ring oscillator 38 is one example. Other types of oscillators may be used to generate the output signal at the offset frequency ($f_{OFFSET}$). The noise requirements of the ring oscillator 38 are relaxed. For instance, in one embodiment, the noise requirements of the ring oscillator 38 are such that the integrated noise is below the level of cancellation desired. The ring oscillator 38 is configured by a control signal (CENTER FREQUENCY) from, e.g., a controller on the IC 28 or external to the IC 28 to provide an output signal at the offset frequency ($f_{OFFSET}$). The phase and amplitude of the output signal of the ring oscillator 38 are adjusted by the phase adjustment circuitry 40 and the amplitude adjustment circuitry 42, respectively, to provide the compensation signal ($S_{COMP}$). The phase adjustment made by the phase adjustment circuitry 40 is controlled via the phase control input ($\phi_{COMP,CNTL}$) from the error signal detector 36, and the amplitude adjustment made by the amplitude adjustment circuitry 42 is controlled via the amplitude control input ($A_{COMP,CNTL}$) from the error signal detector 36.

In this embodiment, the CO 30-1 includes the inductor 32-1, capacitors 44 and 46, and a pair of cross-coupled transistors 48 and 50 having cross-coupled gates and drains. A control signal from the PLL 26-1 is applied to the capacitor 44. This control signal is provided by the PLL 26-1 such that the output signal of the CO 30-1 is phase-locked to an output of a reference oscillator (e.g., a Crystal Oscillator (XO)). The reference oscillator is typically external to the IC 28 but may alternatively be included in the IC 28. The compensation signal ($S_{COMP}$) is applied to the capacitor 46 (i.e., switches the capacitance of the capacitor 46) such that the compensation signal ($S_{COMP}$) modulates the output signal of the CO 30-1 to provide the compensation sideband signals, as discussed above. Thus, the capacitor 46 has a variable capacitance and may be implemented as, for example, a varactor diode having a variable capacitance, a capacitor bank where capacitors are switched into and out of the capacitor bank to provide a variable capacitance, or the like. Note that while the compensation signal ($S_{COMP}$) is injected by capacitive coupling in this embodiment, the present disclosure is not limited thereto. For example, the compensation signal ($S_{COMP}$) may alternatively be injected in some other path that causes phase modulation of the CO 30-1.

In one embodiment, the compensation signal ($S_{COMP}$) is a square-wave signal. As such, the compensation signal ($S_{COMP}$) will cause odd harmonic sidebands with a magnitude of $1/N_{HARMONIC}$, where $N_{HARMONIC}$ is the number of the harmonic (e.g., 3, 5, 7, etc.). In many applications, these harmonic sidebands will not be an issue. However, if these harmonics are a problem, then a more elaborate compensation signal ($S_{COMP}$) may be used (e.g., a sinusoid that controls the capacitance of a varactor diode used as the capacitor 46).

Figure 5:
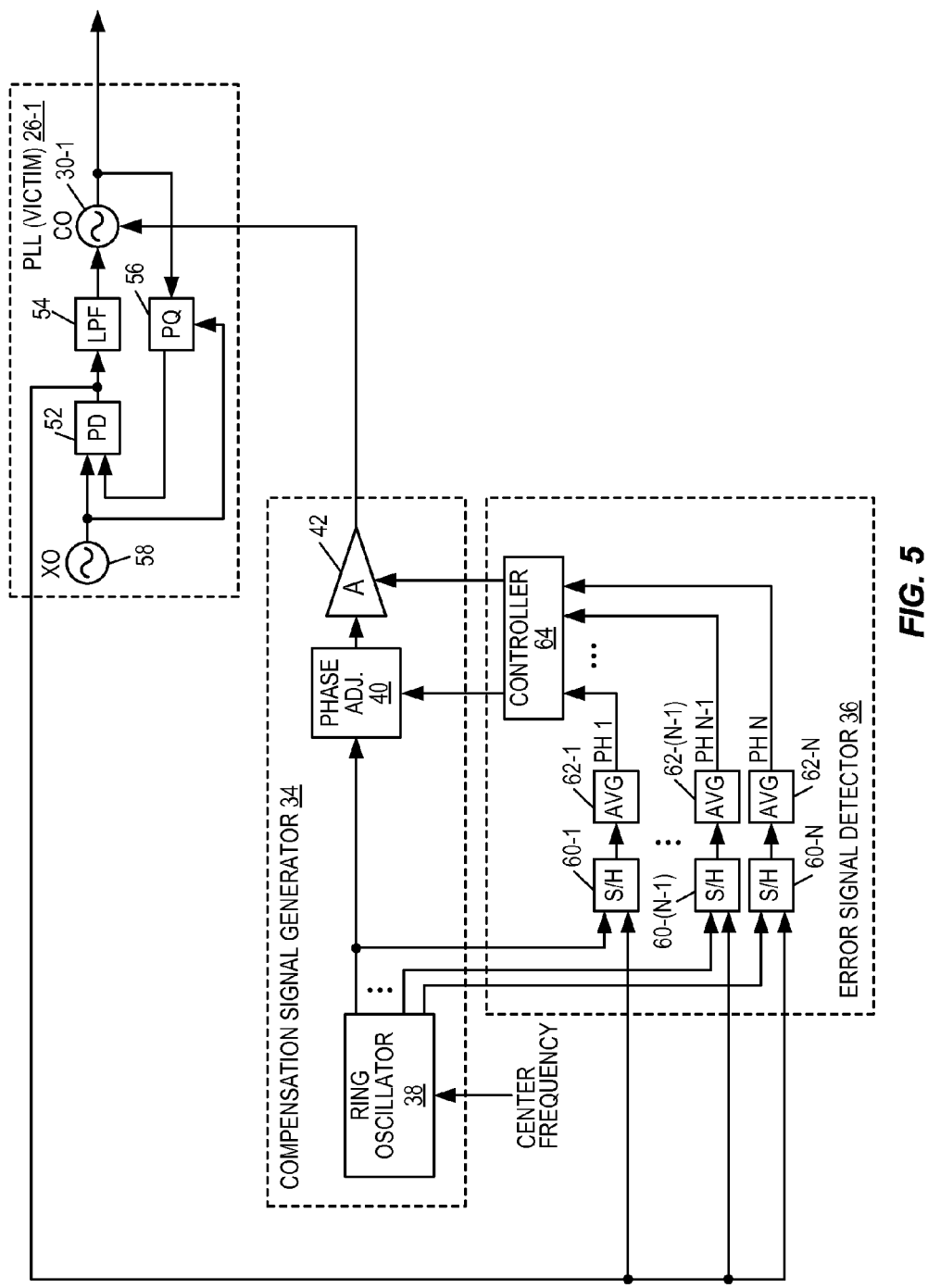
FIG. 5 illustrates the system of FIG. 3 in more detail according to another embodiment of the present disclosure.

The discussion above describes the manner in which the compensation signal ($S_{COMP}$) is generated. The discussion now turns to the error signal detector 36. In this regard, FIG. 5 is a more detailed illustration of the victim PLL 26-1, the compensation signal generator 34, and in particular the error signal detector 36 according to one embodiment of the present disclosure. The victim PLL 26-1 includes a Phase Detector (PD) 52, a Low-Pass Filter (LPF) 54, the CO 30-1, and a Phase Quantizer (PQ) 56 connected in a loop configuration. The victim PLL 26-1 may also include a reference XO 58. However, the reference XO 58 may alternatively be viewed as external to the victim PLL 26-1 (e.g., an external component of the IC 28). In one embodiment, the CO 30-1 is a Digitally Controlled Oscillator (DCO). In another embodiment, the CO 30-1 is a Voltage Controlled Oscillator (VCO). In operation, the PQ 56 and the PD 52 operate to detect a phase difference between the output of the CO 30-1 (including both the desired output signal at the output frequency ($f_1$) and the (compensated) crosstalk sideband signals) and a reference oscillator signal provided by the reference XO 58. The PD output is passed through the LPF 54, and the resulting control signal is applied to the CO 30-1.

The error signal detector 36 includes a number of correlators, which in this example are implemented as Sample and Hold (S/H) circuits 60-1 through 60-N and averaging circuits 62-1 through 62-N. The correlators operate to correlate the PD output signal output by the PD 52 in the victim PLL 26-1 and N different delayed versions of the output signal of the ring oscillator 38. In this particular embodiment, the ring oscillator 38 outputs the N different delayed versions of the output signal. For example, the ring oscillator 38 may be a multistage ring oscillator where the N different delayed versions are provided by a multistage ring oscillator. The N different delayed versions of the output signal of the ring oscillator 38 correspond to N different phase shifts. The S/H circuits 60-1 through 60-N sample the PD output signal using the corresponding delayed versions of the output signal of the ring oscillator 38. The sampled outputs are then averaged by the averaging circuits 62-1 through 62-N to, e.g., reduce noise at the expense of convergence time. By averaging the outputs of the S/H circuits 60-1 through 60-N, the correlator outputs become vectors indicating both the phase of the error signal and an amplitude of the error signal.

Note that when the offset frequency ($f_{OFFSET}$) is higher than half of the sampling frequency of the victim PLL 26-1, the PD output signal will be a folded version of the real error signal. This can be taken into account in the sampling process. For example, the output signal of the ring oscillator 38 may also be sampled with the sampling clock of the PD 52.

A controller 64 processes the N outputs (which are labelled PH 1 through PH N) of the N correlators to determine an estimate of the phase of the error signal, which is then an estimate of the phase of the crosstalk signal injected into the CO 30-1 of the victim PLL 26-1 from the CO 30-2 of the interfering PLL 26-2. In one embodiment, the phase of the delayed version of the output signal input having the highest correlation with the PD output signal is determined to be the approximate phase of the error signal (and thus the approximate phase of the crosstalk signal). In another embodiment, an estimate of the phase of the delayed version of the output signal may be interpolated from the correlator outputs. Conversely, in another embodiment, the controller 64 processes the N outputs of the N correlators to directly determine the optimal phase of the compensation signal ($S_{COMP}$). For example, the phase of the delayed version of the output signal input having the highest negative correlation with the PD output signal is approximately 180 degrees out-of-phase with the phase of the error signal. As such, this phase is determined to be the optimal phase of the compensation signal ($S_{COMP}$).

Figure 6:
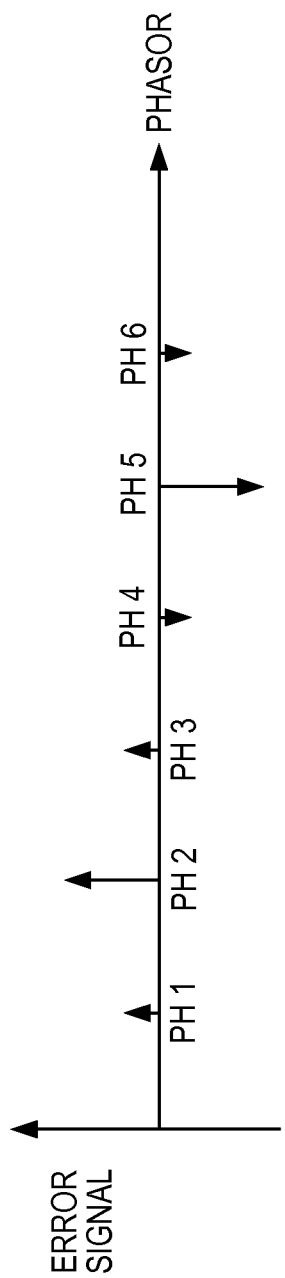
FIG. 6 illustrates one example of the outputs of the correlators in the error signal detector of FIG. 5 according to one embodiment of the present disclosure.

One example of the outputs of the correlators for a six correlator embodiment is illustrated in FIG. 6. By processing these outputs, the controller 64 determines that the maximum correlation exists for the $2^{nd}$ correlator (i.e., the correlator that outputs PH 2). Thus, in one embodiment, the controller 64 determines that the phase of the error signal is approximately equal to the phase of the delayed version of the output signal of the ring oscillator 38 input to the $2^{nd}$ correlator. The number (N) of correlators in the error signal detector 36 may vary depending on the particular implementation. For instance, the number (N) of correlators (and thus the number of delayed versions of the output signal of the ring oscillator 38) may be increased to increase the accuracy of the phase estimate for the error signal. The number (N) of correlators may be a tradeoff between the accuracy of the phase estimate and complexity (and thus cost).

Figure 7:
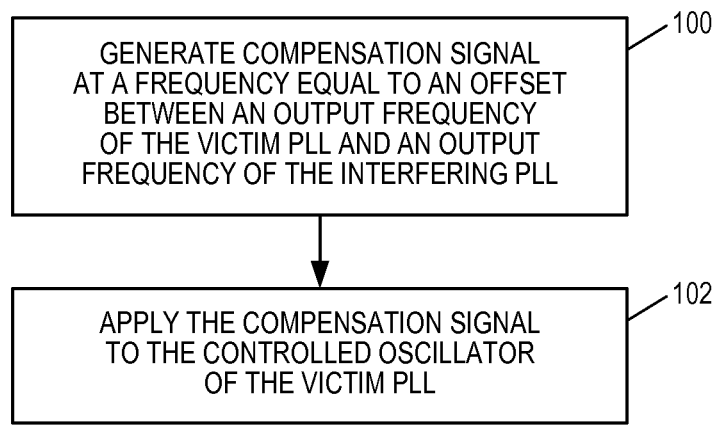
FIG. 7 is a flow chart that illustrates a process for mitigating crosstalk according to one embodiment of the present disclosure.

FIG. 7 is a flow chart that illustrates a process for mitigating crosstalk between PLLs in an IC according to one embodiment of the present disclosure. This process is described with respect to the system 24 described above. However, this process is not limited thereto. In order to mitigate the crosstalk signal injected into the victim PLL 26-1 from the interfering PLL 26-2, the compensation signal ($S_{COMP}$) is generated at the offset frequency ($f_{OFFSET}$) between the output frequencies ($f_1$ and $f_2$) of the PLLs 26-1 and 26-2 (step 100). The compensation signal ($S_{COMP}$) is then applied to the CO 30-1 of the victim PLL 26-1 to thereby mitigate the crosstalk signal (step 102). More specifically, as discussed above, the compensation signal ($S_{COMP}$) modulates the output signal of the CO 30-1 to thereby create compensation sideband signals that mitigate the crosstalk sideband signals resulting from the crosstalk signal. As a result, the crosstalk signal is mitigated.

Figure 8:
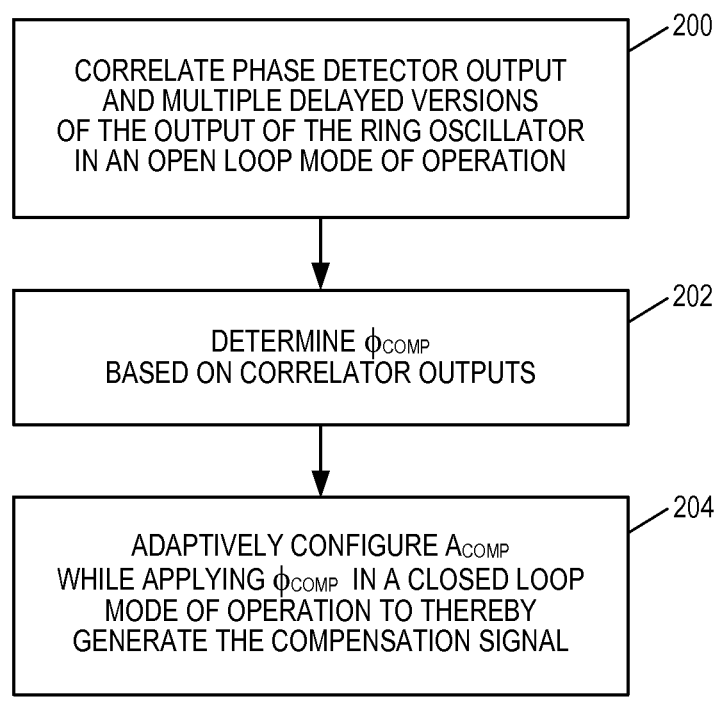
FIG. 8 is a flow chart that illustrates a process for configuring an amplitude and phase of a compensation signal for mitigating crosstalk according to one embodiment of the present disclosure.

FIG. 8 is a flow chart that illustrates a process for configuring the amplitude ($A_{COMP}$) and the phase ($\phi_{COMP}$) of the compensation signal ($S_{COMP}$) according to one embodiment of the present disclosure. This process is described with respect to the system 24 described above and, in particular, the embodiment of FIG. 6. First, during an open loop mode in which the compensation signal ($S_{COMP}$) is not injected into the CO 30-1, the error signal detector 36 correlates the PD output signal and the N delayed versions of the output signal of the ring oscillator 38 (step 200). The controller 64 determines the phase ($\phi_{COMP}$) of the compensation signal ($S_{COMP}$) based on the outputs of the correlators, as described above (step 202). The error signal detector 36 provides the corresponding phase control input ($\phi_{COMP,CNTL}$) to the phase adjustment circuitry 40 to thereby configure the phase of the compensation signal ($S_{COMP}$).

Once the phase ($\phi_{COMP}$) of the compensation signal ($S_{COMP}$) is configured, the compensation signal ($S_{COMP}$) is applied to the CO 30-1 for a closed loop mode of operation. During the closed loop mode of operation, while applying $\phi_{COMP}$ (i.e., while maintaining the phase control input ($\phi_{COMP,CNTL}$) such that the phase ($\phi_{COMP}$) of the compensation signal ($S_{COMP}$) is maintained as the value determined in step 202), the error signal detector 36 monitors the output of the correlator corresponding to the approximate phase of the error signal and adaptively adjusts the amplitude ($A_{COMP}$) of the compensation signal ($S_{COMP}$) to minimize the error signal (step 204). The error signal detector 36 provides the corresponding amplitude control input ($A_{COMP,CNTL}$) to the amplitude adjustment circuitry 38 to thereby configure the amplitude of the compensation signal (Scamp). When operating in the closed loop mode, an appropriate loop gain, robust dynamics, and sufficiently fast convergence may be used in the feedback path to avoid oscillations. Separating the configuration of the phase ($\phi_{COMP}$) and the amplitude ($A_{COMP}$) as done in e.g. the process of FIG. 8 speeds up convergence.

The systems and methods disclosed herein provide numerous advantages. While not being limited to or by any particular advantage, as one example, the systems and methods disclosed herein enable compensation of the crosstalk signal on an "as needed" basis. By doing so, power consumption and possible additional interference can be minimized. As another example, the systems and methods disclosed herein allow support for more simultaneous Carrier Aggregation (CA) frequency bands on the same die/IC area.

The following acronyms are used throughout this disclosure.

3GPP $3^{rd}$ Generation Partnership Project
CA Carrier Aggregation
CO Controlled Oscillator
dB Decibel
DCO Digitally Controlled Oscillator
E-UTRA Evolved Universal Terrestrial Radio Access
FDD Frequency Division Duplexing
GSM Global System for Mobile Communications
IC Integrated Circuit
LC Inductor and Capacitor
LO Local Oscillator
LPF Low-Pass Filter
LTE Long Term Evolution
PD Phase Detector
PLL Phase-Locked Loop
PQ Phase Quantizer
RAN Radio Access Network
RF Radio Frequency
S/H Sample and Hold
VCO Voltage Controlled Oscillator
WLAN Wireless Local Area Network
XO Crystal Oscillator Those skilled in the art will recognize improvements and modifications to the embodiments of the present disclosure. All such improvements and modifications are considered within the scope of the concepts disclosed herein and the claims that follow.

What is claimed is:

1. A system, comprising:
a first phase-locked loop comprising a first controlled LC oscillator comprising a first resonant tank comprising an inductor and one or more capacitors and adapted to provide an output signal at a first frequency;
a second phase-locked loop comprising a second controlled LC oscillator comprising a second resonant tank comprising an inductor and one or more capacitors and adapted to provide an output signal at a second frequency; and
a compensation signal generator adapted to:
generate a compensation signal at an offset frequency that is approximately equal to an offset between the first frequency and the second frequency; and
apply the compensation signal to the first controlled oscillator by switching a capacitor of the one or more capacitors in the first resonant tank of the first controlled LC oscillator such that the output signal of the first controlled oscillator is modulated by the compensation signal;
wherein an amplitude and phase of the compensation signal are such that, when the compensation signal is applied to the first controlled oscillator, a crosstalk signal in the output signal of the first controlled oscillator resulting from crosstalk from the second controlled oscillator of the second phase-locked loop to the first controlled oscillator of the first phase-locked loop is mitigated.

2. The system of claim 1 wherein the compensation signal generator comprises:
an oscillator adapted to provide an output signal at the offset frequency; and
adjustment circuitry adapted to adjust an amplitude and phase of the output signal of the oscillator to provide the compensation signal at the offset frequency.

3. The system of claim 2 wherein the oscillator is a ring oscillator.

4. The system of claim 2 further comprising an error signal detector adapted to detect the crosstalk signal and control the amplitude and the phase of the compensation signal via the adjustment circuitry such that the crosstalk signal is mitigated.

5. The system of claim 4 wherein the error signal detector comprises:
a plurality of correlators adapted to correlate a phase detector output signal of a phase detector of the first phase-locked loop and a plurality of delayed versions of the output signal of the oscillator to provide a plurality of correlator output signals, wherein each correlator of the plurality of correlators correlates the phase detector output signal with a different one of the plurality of delayed versions of the output signal of the oscillator; and
a controller adapted to detect a phase of the crosstalk signal based on the plurality of correlator output signals.

6. The system of claim 5 wherein the controller is further adapted to control the phase of the compensation signal via the adjustment circuitry such that the phase of the compensation signal is approximately 180 degrees out-of-phase with the crosstalk signal.

7. The system of claim 6 wherein the controller is further adapted to control the amplitude of the compensation signal via the adjustment circuitry such that an amplitude of the crosstalk signal is minimized.

8. The system of claim 6 wherein the controller is further adapted to control the amplitude of the compensation signal via the adjustment circuitry such that an amplitude of one of the plurality of correlator output signals for one of the plurality of correlators that corresponds to the phase of the crosstalk signal is minimized.

9. The system of claim 1 wherein the first phase-locked loop is an all digital phase-locked loop.

10. A method of mitigating a crosstalk signal in an output signal of a controlled oscillator of a victim phase-locked loop resulting from crosstalk between a controlled oscillator of an interfering phase-locked loop and the controlled oscillator of the victim phase-locked loop, comprising:
   generating a compensation signal at an offset frequency that is approximately equal to an offset between an output frequency of the controlled oscillator of the victim phase-locked loop and an output frequency of the controlled oscillator of the interfering phase-locked loop; and
   applying the compensation signal to the controlled oscillator of the victim phase-locked loop such that the output signal of the controlled oscillator of the victim phase-locked loop is modulated by the compensation signal;
   wherein an amplitude and phase of the compensation signal are such that, when the compensation signal is applied to the controlled oscillator of the victim phase-locked loop, the crosstalk signal in the output signal of the controlled oscillator of the victim phase-locked loop resulting from the crosstalk from the controlled oscillator of the interfering phase-locked loop to the controlled oscillator of the victim phase-locked loop is mitigated;
   wherein the controlled oscillator of the victim phase-locked loop is a controlled LC oscillator comprising a resonant tank comprising an inductor and one or more capacitors, and applying the compensation signal to the controlled oscillator of the victim phase-locked loop comprises switching a capacitor of the one or more capacitors in the resonant tank of the controlled LC oscillator with the compensation signal.

11. The method of claim 10 wherein generating the compensation signal comprises:
   generating a signal at the offset frequency; and
   adjusting an amplitude and phase of the signal at the offset frequency to thereby provide the compensation signal at the offset frequency.

12. The method of claim 11 wherein generating the signal at the offset frequency comprises generating the signal at the offset frequency via a ring oscillator.

13. The method of claim 11 further comprising:
   detecting the crosstalk signal; and
   controlling the amplitude and the phase of the compensation signal such that the crosstalk signal is mitigated.

14. The method of claim 13 wherein detecting the crosstalk signal comprises:
   correlating a phase detector output signal of a phase detector of the victim phase-locked loop and a plurality of delayed versions of the signal at the offset frequency to provide a plurality of correlated signals, wherein each correlated signal of the plurality of correlated signals is for a correlation of the phase detector output signal and a different one of the plurality of delayed versions of the signal at the offset frequency; and
   detecting a phase of the crosstalk signal based on the plurality of correlated signals.

15. The method of claim 14 wherein controlling the amplitude and the phase of the compensation signal comprises controlling the phase of the compensation signal such that the phase of the compensation signal is approximately 180 degrees out-of-phase with the crosstalk signal.

16. The method of claim 15 wherein controlling the amplitude and the phase of the compensation signal further comprises adjusting the amplitude of the compensation signal such that an amplitude of the crosstalk signal is minimized.

17. The method of claim 13 wherein:
   detecting the crosstalk signal comprises, in an open loop mode of operation:
      correlating a phase detector output signal of a phase detector of the victim phase-locked loop and a plurality of delayed versions of the signal at the offset frequency to provide a plurality of correlated signals, wherein each correlated signal of the plurality of correlated signals is for a correlation of the phase detector output signal and a different one of the plurality of delayed versions of the signal at the offset frequency; and
      detecting a phase of the crosstalk signal based on the plurality of correlated signals; and
   controlling the amplitude and the phase of the compensation signal comprises:
      configuring the phase of the compensation signal such that the phase of the compensation signal is approximately 180 degrees out-of-phase with the crosstalk signal; and
      after configuring the phase of the compensation signal, adaptively adjusting the amplitude of the compensation signal in a closed loop mode of operation such that an amplitude of the crosstalk signal is minimized.

18. A wireless device, comprising:
   a first phase-locked loop comprising a first controlled LC oscillator comprising a first resonant tank comprising an inductor and one or more capacitors and adapted to provide an output signal at a first frequency;
   a second phase-locked loop comprising a second controlled LC oscillator comprising a second resonant tank comprising an inductor and one or more capacitors and adapted to provide an output signal at a second frequency; and
   a compensation signal generator adapted to:
      generate a compensation signal at an offset frequency that is approximately equal to an offset between the first frequency and the second frequency; and
      apply the compensation signal to the first controlled oscillator by switching a capacitor of the one or more capacitors in the first resonant tank of the first controlled LC oscillator such that the output signal of the first controlled oscillator is modulated by the compensation signal;
   wherein an amplitude and phase of the compensation signal are such that, when the compensation signal is applied to the first controlled oscillator, a crosstalk signal in the output signal of the first controlled oscillator resulting from crosstalk from the second controlled oscillator of the second phase-locked loop to the first controlled oscillator of the first phase-locked loop is mitigated.

* * * * *